US008816489B2

(12) United States Patent
Sandhu et al.

(10) Patent No.: US 8,816,489 B2
(45) Date of Patent: Aug. 26, 2014

(54) INTEGRATED CIRCUIT STRUCTURES, SEMICONDUCTOR STRUCTURES, AND SEMICONDUCTOR DIE

(75) Inventors: Gurtej S. Sandhu, Boise, ID (US); Krishna K. Parat, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/471,048

(22) Filed: May 14, 2012

(65) Prior Publication Data

US 2012/0223409 A1 Sep. 6, 2012

Related U.S. Application Data

(62) Division of application No. 12/392,742, filed on Feb. 25, 2009, now Pat. No. 8,198,172.

(51) Int. Cl.
*H01L 23/02* (2006.01)
*H01L 21/30* (2006.01)

(52) U.S. Cl.
USPC .................. 257/686; 257/724; 257/E25.013; 438/458

(58) Field of Classification Search
None
See application file for complete search history.

(56) References Cited

U.S. PATENT DOCUMENTS 5,131,979 A 7/1992 Lawrence
5,374,564 A 12/1994 Bruel
5,426,072 A 6/1995 Finnila
5,882,987 A 3/1999 Srikrishnan
5,951,813 A 9/1999 Warren
5,966,620 A 10/1999 Sakaguchi et al.
5,998,808 A 12/1999 Matsushita
6,180,496 B1 1/2001 Farrens et al.
6,284,628 B1 9/2001 Kuwahara et al.
6,303,468 B1 10/2001 Aspar et al.
6,335,258 B1 1/2002 Aspar et al.
6,346,488 B1 2/2002 Kabansky
6,489,237 B1 * 12/2002 Wu .............................. 438/671
6,693,047 B1 2/2004 Lu et al.
6,719,188 B2 * 4/2004 Farooq et al. ................ 228/264
6,720,640 B2 4/2004 Kuwabara et al.
6,756,286 B1 6/2004 Moriceau et al.
6,809,044 B1 10/2004 Aspar et al.
6,884,697 B2 4/2005 Schwarzenbach et al.
6,946,365 B2 9/2005 Aspar et al.
7,067,926 B2 6/2006 Yamazaki et al.
RE39,484 E 2/2007 Bruel
7,180,168 B2 * 2/2007 Imai ............................. 257/686
7,256,101 B2 8/2007 Letertre et al.
7,297,611 B2 11/2007 Maleville
7,312,487 B2 12/2007 Alam et al.

(Continued)

FOREIGN PATENT DOCUMENTS

CN 101140861 3/2008
CN 1771583 5/2013

(Continued)

*Primary Examiner* — Alonzo Chambliss
(74) *Attorney, Agent, or Firm* — Wells St. John, P.S.

(57) ABSTRACT

Methods for fabricating integrated circuit devices on an acceptor substrate devoid of circuitry are disclosed. Integrated circuit devices are formed by sequentially disposing one or more levels of semiconductor material on an acceptor substrate, and fabricating circuitry on each level of semiconductor material before disposition of a next-higher level. After encapsulation of the circuitry, the acceptor substrate is removed and semiconductor dice are singulated. Integrated circuit devices formed by the methods are also disclosed.

15 Claims, 4 Drawing Sheets

(56) References Cited

U.S. PATENT DOCUMENTS

| | | | | |
|---|---|---|---|---|
| 7,329,587 | B2 | 2/2008 | Bruederl et al. | |
| 7,405,136 | B2 | 7/2008 | Delprat et al. | |
| 7,511,380 | B2 | 3/2009 | Yamazaki et al. | |
| 7,563,697 | B2 | 7/2009 | Morimoto et al. | |
| 7,709,353 | B2 | 5/2010 | Ono et al. | |
| 7,977,145 | B2 | 7/2011 | Hannebauer et al. | |
| 8,198,172 | B2 * | 6/2012 | Sandhu et al. | 438/458 |
| 2004/0140547 | A1 | 7/2004 | Yamazaki et al. | |
| 2005/0087829 | A1 | 4/2005 | Merrill et al. | |
| 2006/0099776 | A1 | 5/2006 | Dupont | |
| 2006/0121691 | A1 | 6/2006 | Noguchi et al. | |
| 2006/0211159 | A1 | 9/2006 | Bruederl et al. | |
| 2006/0214306 | A1 | 9/2006 | Yamazaki et al. | |
| 2007/0087526 | A1 | 4/2007 | Chhaimi et al. | |
| 2007/0096263 | A1 | 5/2007 | Furukawa et al. | |
| 2007/0122998 | A1 | 5/2007 | Droes et al. | |
| 2007/0296073 | A1 | 12/2007 | Wu et al. | |
| 2008/0160723 | A1 | 7/2008 | Hannebauer | |
| 2009/0014843 | A1 * | 1/2009 | Kawashita et al. | 257/621 |
| 2009/0023269 | A1 | 1/2009 | Morimoto et al. | |

FOREIGN PATENT DOCUMENTS

| | | |
|---|---|---|
| CN | 201080009005.0 | 6/2013 |
| EP | 1432032 | 6/2004 |
| EP | 1662555 | 5/2006 |
| KR | 10-2006-0061305 | 6/2006 |
| TW | 099105333 | 12/2012 |
| WO | PCT/US2010/024956 | 9/2010 |
| WO | PCT/US2010/024956 | 9/2011 |

* cited by examiner

INTEGRATED CIRCUIT STRUCTURES, SEMICONDUCTOR STRUCTURES, AND SEMICONDUCTOR DIE

RELATED PATENT DATA

This patent resulted from a divisional application of U.S. patent application Ser. No. 12/392,742, filed Feb. 25, 2009 now U.S. Pat. No. 8,198,172, entitled "Methods of Forming Integrated Circuits Using Donor And Acceptor Substrates", naming Gurtej S. Sandhu and Krishna Parrat as inventors, the disclosure of which is incorporated by reference.

TECHNICAL FIELD

The present invention, in various embodiments, relates generally to methods for fabricating integrated circuit devices, such as memory, logic or application specific integrated circuits (ASICs) without consuming an acceptor semiconductor substrate on which the integrated circuit devices are formed. More specifically, embodiments of the invention include integrated circuit fabrication methods in which semiconductor material is provided for fabrication of integrated circuits at one or more levels over an acceptor substrate having no circuitry thereon. In addition, embodiments of the present invention comprise multi-level integrated circuits.

BACKGROUND

Conventionally, three-dimensional (3D) integrated circuit (IC) devices have been fabricated to improve chip density, by initially forming individual circuit devices and subsequently stacking and bonding the chips together to form a multi-level chip stack or assembly. Consequently, the time, materials and process acts expended in carrying out individual chip fabrication, forming an assembly and electrically connecting the chips results in undesirably high cost. Moreover, stacking and electrical connection of the individually fabricated chips may lead to increased resistance and signal delay in the overall circuit due to undesirably long signal paths. Further, transmission of signals through wiring of one layer of the assembly may electrically interfere with wiring on other layers, e.g., cross-talk.

Another technique that has been suggested to increase chip density, for minimization of design dimension, is a so-called "bottom-up" approach. In this approach, circuits are fabricated conventionally on a base substrate, such as a silicon-on-insulator (SOI) wafer, followed by growth of successive layers of silicon on the wafer to provide an active surface and fabrication of additional circuit levels on each successive silicon layer prior to growth of the next-higher level. The process is repeated to create a device having a desired number of layers. One of the difficulties of this approach is that each circuit level, other than the last fabricated, is exposed to multiple thermal cycles as subsequent levels are formed. Further, due to the thermal cycling required by a bottom-up approach, suitable material choices for circuit structures are limited. Additionally, this approach requires an excessive amount of time as a consequence of growing each new layer of silicon on the base substrate.

Further, the foregoing approaches to multi-level circuit fabrication each require the use, and consumption, of a silicon wafer or other bulk substrate, which bulk substrate comprises a significant portion of the total cost of the fabrication process, on the order of twenty to thirty percent.

Accordingly, there are needs for processes to make 3D integrated circuits more efficiently and with reduced expense, while facilitating minimization of the overall dimensions of the device.

BRIEF DESCRIPTION OF THE DRAWINGS

In the drawings, in which various features of embodiments of the present invention are depicted.

DETAILED DESCRIPTION

The illustrations presented herein are not meant to be actual views of any particular memory devices, logic devices, ASIC devices, or other semiconductor devices, but are merely idealized representations which are employed to describe the present invention in various embodiments. Further, the relative dimensions of some elements of the drawings, such as for example thicknesses of various materials, may be exaggerated for clarity. Additionally, elements common between figures may retain the same or similar numerical designation.

The present invention comprises embodiments of methods of fabricating integrated circuit devices on an acceptor substrate without consumption thereof, as well as resulting integrated circuit devices, which may comprise multiple levels of integrated circuitry sequentially fabricated on superposed levels of semiconductor foundation material. The term "three-dimensional integrated circuit" as used herein, means and includes a plurality of integrated circuits arranged in planes or levels disposed vertically, one above another. The terms "form" and "forming" as used herein, encompass both disposition of a material as a final material or components thereof, and in situ formation of a material. The term "another" as used herein, means and includes both a component or structure used a plurality of times, as well as an additional occurrence of fabrication of a type of component or structure.

Figure 1A:
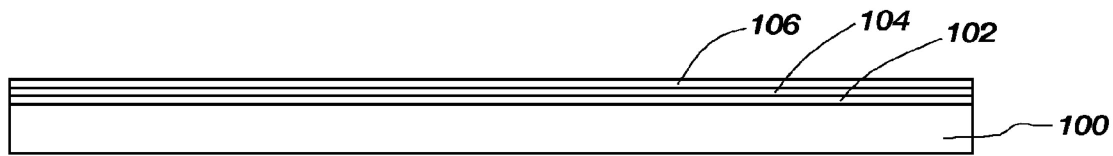
FIGS. 1A through 1I comprise schematic representations of semiconductor structures formed during a process flow according to an embodiment of the present invention for fabrication of an integrated circuit.

An embodiment of a process for fabricating a multi-level integrated circuit according to the present invention is described. In FIG. 1A, a sacrificial material 102 is formed on a base substrate, which may also be characterized as an acceptor substrate 100. A passivation material 104 is then formed on sacrificial material 102, followed by another, dielectric material 106. Acceptor substrate 100 may comprise, by way of non-limiting example, monocrystalline silicon, and may comprise a new wafer or a reject wafer on which defective semiconductor devices have been fabricated. Acceptor substrate 100 may also comprise a substrate of another material, such as a ceramic, having a coefficient of thermal expansion (CTE) similar to that of a semiconductor material of a donor substrate to be bonded thereto as described below, to which sacrificial material 102 may bond, and highly resistant to an etchant for sacrificial material 102. In any case, acceptor substrate 100 may be of sufficient thickness and structural integrity to withstand mechanical stresses thereon without detectable deformation during handling and processing. Sacrificial material 102 may comprise a material which may be etched selective to silicon such as, by way of example, a silicon oxide (SiOx, e.g., SiO or SiO2), and may comprise a thickness of, for example, between about 2000 Å and 2 μm. Passivation material 104 may comprise, for example, silicon nitride (Si3N4), and comprise a thickness of, for example, between about 1000 Å and about 5000 Å. Dielectric material 106 may also comprise a silicon oxide (SiOx) and comprise a thickness, for example, between about 2000 Å and 2 μm. Techniques for deposition and in situ growth of silicon oxides and silicon nitride are well known to those of ordinary skill in the art. The silicon oxide may be formed, for example, by chemical vapor deposition (CVD), such as low pressure CVD or plasma enhanced CVD, spin-on deposition, thermal decomposition of tetraethyl orthosilicate (TEOS), or may be thermally grown. Silicon nitride may be deposited, for example, by CVD or atomic layer deposition (ALD).

Figure 1B:
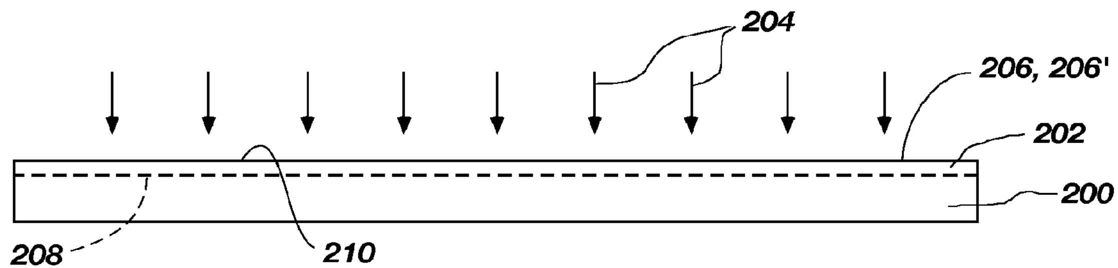

As shown in FIG. 1B and independent of the foregoing process described in association with FIG. 1A, a donor substrate 200 is processed. The donor substrate 200 may comprise any structure that includes a layer of semiconductor type material including, for example, silicon, germanium, gallium arsenide, indium phosphide, and other III-V or II-VI type semiconductor materials. By way of non-limiting example, the donor substrate 200 may comprise silicon. The donor substrate 200 will be used to dispose a semiconductor foundation material over acceptor substrate 100, as described in further detail below.

As a non-limiting example, the foundation semiconductor material may be placed on acceptor substrate 100 by a process described herein using a modification of so-called SMART-CUT® technology. Such processes are described in detail in, for example, U.S. Pat. No. RE 39,484 to Bruel, U.S. Pat. No. 6,303,468 to Aspar et al., U.S. Pat. No. 6,335,258 to Aspar et al., U.S. Pat. No. 6,756,286 to Moriceau et al., U.S. Pat. No. 6,809,044 to Aspar et al., U.S. Pat. No. 6,946,365 to Aspar et al., and U.S. Patent Application Publication No. 2006/0099776 to Dupont. However, other processes suitable for fabricating a semiconductor material on the surface of acceptor substrate 100 may also be used, if sufficiently low processes temperatures are maintained. In conventional implementation of SMART-CUT® technology, donor and acceptor wafers are bonded together using a high temperature anneal, on the order of about 1000° C. to about 1300° C. Such temperatures are unacceptable for use when a substrate already bears circuitry fabricated thereon. For example, processing temperatures should not exceed about 800° C. when flash memory is fabricated. However, an additional plasma activation act may be integrated into a conventional SMART-CUT® technology fabrication process to lower a required substrate bonding temperature, as described in detail below.

In an embodiment, a plurality of ions of rare gases (e.g., neon, argon, krypton, or xenon), hydrogen, or helium may be implanted into the donor substrate 200 to form an implanted region 202. As represented by directional arrows 204, a conventional ion source (not shown) may be used to implant the plurality of ions into the donor substrate 200 in a direction substantially perpendicular to a major surface 206 of the donor substrate 200 to create the implanted region 202, which may also be characterized as a transfer region, the inner boundary 208 of which is shown in the donor substrate 200 in broken lines. As known in the art, the depth to which the ions are implanted into the donor substrate 200 is at least partially a function of the energy with which the ions are implanted. Generally, ions implanted with less energy will be implanted at relatively lesser depths, while ions implanted with higher energy will be implanted at relatively greater depths. The inner boundary 208 of implanted region 202 lies substantially parallel to the major surface 206 of the donor substrate 200 and is at a preselected depth which is dependent on selected parameters of the atomic species implant process, as is well known to one of ordinary skill in the art. As a non-limiting example, hydrogen ions may be implanted into the donor substrate with an energy selected to form the inner boundary 208 at a depth D of between about eighty nanometers (80 nm) and about five hundred nanometers (500 nm) (about 800 Å to about 5000 Å), and more particularly, of about two hundred nanometers (200 nm) (about 2000 Å) within the donor substrate 200.

The inner boundary 208 of implanted region 202 comprises a layer of microbubbles or microcavities (not shown) comprising the implanted ion species, and provides a weakened structure within donor substrate 200. The donor substrate 200 may then be thermally treated at a temperature above that at which ion implantation is effected, in accordance with the disclosures of the patent documents in the preceding paragraph, to effect crystalline rearrangement in the semiconductor material of the donor substrate 200 and coalescence of the microbubbles or microcavities.

An attachment surface 210 to be bonded to dielectric material 106 on acceptor substrate 100 (FIG. 1A) may be formed on donor substrate 200 by exposing the major surface 206 of the donor substrate 200 to a reactive ion etching (RIE) plasma including hydrogen or an inert gas (e.g., argon, oxygen, or nitrogen) to form a plasma-activated major surface 206'. The plasma-activated major surface 206' increases the kinetics of a subsequent bonding act in the form of an oxide reaction with an adjacent surface of the dielectric material 106 overlying the acceptor substrate 100 due to the increased mobility and reactivity of the ionic species (e.g., hydrogen) created on attachment surface 210. By utilizing a plasma-activated material, the wafer bonding process may be performed at temperatures of less than about four hundred degrees Celsius (400° C.). Plasma-activated bonding is described in U.S. Pat. No. 6,180,496 to Farrens et al., assigned to Silicon Genesis Corporation.

Figure 1C:
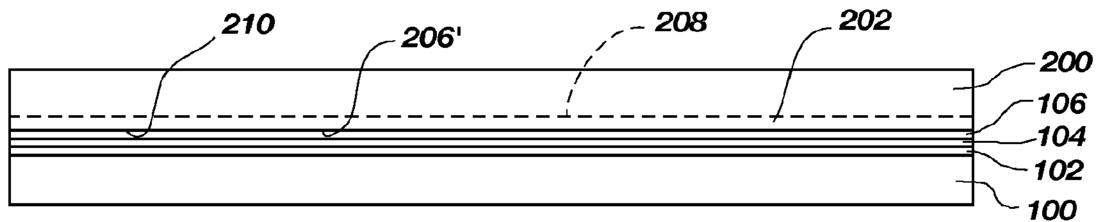

As shown in FIG. 1C, the donor substrate 200 is disposed on the dielectric material 106 carried by acceptor substrate 100 and may be bonded to the dielectric material 106 using an annealing process. The plasma-activated major surface 206' enables annealing at a substantially reduced temperature, as noted above, in comparison to those employed in conventional wafer bonding techniques. Further, the hydrogen or other ions implanted in ion implanted region 202 to the depth of inner boundary 208 makes the silicon in the thermally treated donor substrate 200 susceptible to breakage substantially along inner boundary 208 when a shear force is applied substantially parallel to the major plane of the donor substrate 200. After attaching the donor substrate 200 to the dielectric material 106 on acceptor substrate 100, the portion of the donor substrate 200 on the side of the inner boundary 208 opposing the dielectric material 106 may be cleaved or fractured by applying a shearing force to the donor substrate 200. The portion of the donor substrate 200 below the inner boundary 208, of a thickness, for example, of between about eighty nanometers (80 nm) (about 800 Å) and about four hundred nanometers (400 nm) (about 4000 Å), for example, about two hundred nanometers (200 nm) (about 2000 Å), is detached from the remainder of donor substrate 200 and remains bonded to the acceptor substrate 100 through dielectric material 106, passivation material 104 and sacrificial material 102 to form a foundation material 212, as shown in FIG. 1D.

Donor substrate 200 may then have its new major surface 206*n*, which is substantially at the location of former inner boundary 208 of implanted region 202, smoothed as desired, ion-implanted and plasma-activated in preparation for transfer of another thickness of semiconductor material for use as a foundation material 212. It is contemplated that each donor substrate 200, if comprising a silicon wafer of conventional initial thickness, may be used to donate foundation material 212 at least about ten times, if about a 2000 Å thickness of silicon is transferred each time a layer of silicon is donated. It is further contemplated that, as thicknesses of semiconductor material are removed from the donor substrate 200, it may be desirable to bond a carrier to the back surface of donor substrate 200 to maintain mechanical integrity of the donor substrate 200 during handling, ion implantation, plasma activation, bonding to an acceptor substrate 100 and shearing of each transfer region therefrom.

Figure 1D:
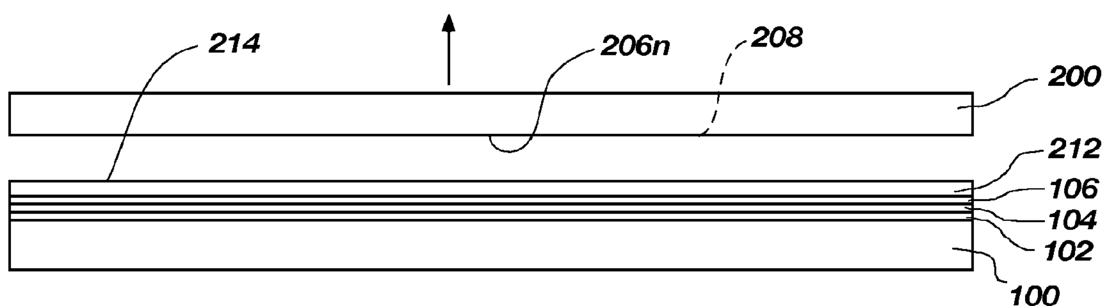

Referring still to FIG. 1D, after the foundation material 212 is separated from the donor substrate 200 and bonded to the dielectric material 106, an exposed surface 214 of the foundation material 212 may be undesirably rough for fabrication of integrated circuitry thereon. To remedy this deficiency, the exposed surface 214 of the foundation material 212 may be smoothed to a desired degree in order to facilitate further processing as described below, according to techniques known in the art such as, for example, one or more of grinding, wet etching, and chemical-mechanical polishing (CMP).

Figure 1E:
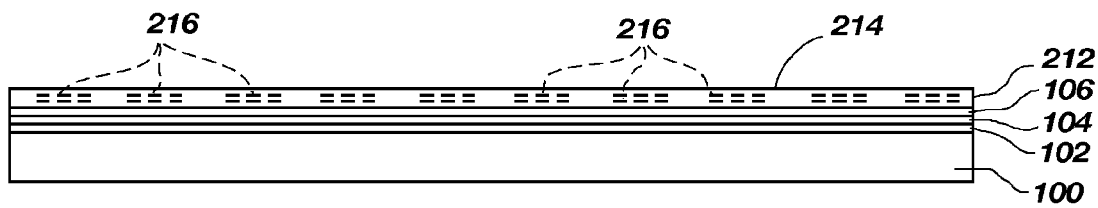

As shown in FIG. 1E, the foundation material 212 may be used as a substrate on which to form a level of circuitry 216, as depicted in broken lines, which may, for example, include a plurality of memory devices such as two-dimensional arrays of NAND flash memory, in accordance with processes known to those of ordinary skill in the art. It is contemplated, however that, as previously mentioned, logic or ASIC circuitry may also be fabricated. In any case, conventional circuitry fabrication techniques may be employed to fabricate integrated circuitry on foundation material 212 in the same manner as employed on a conventional semiconductor substrate such as, for example, a monocrystalline silicon wafer.

Figure 1F:
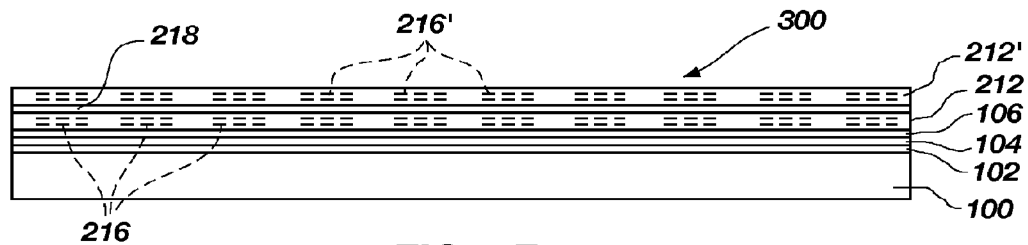
Figure 1G:
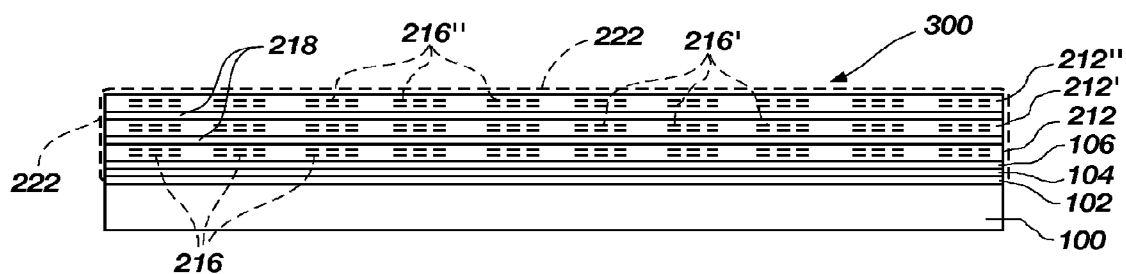

As shown in FIG. 1F, after the level of circuitry 216 is fabricated over foundation material 212, an oxide material 218 (SiOx) is formed or disposed thereover, as by a spin-on-glass technique, a chemical vapor deposition (CVD) technique, such as low pressure CVD or plasma-enhanced CVD, or a spin-on deposition technique. A donor substrate 200 (not shown) (which may comprise the same or another donor substrate 200) which has been ion-implanted, annealed and plasma-treated to enhance bonding is then disposed over and bonded to oxide material 218, and sheared to leave another foundation material 212' bonded to oxide material 218. Another level of circuitry 216' may then be formed over foundation material 212'. This process may be continued, level-by-level, to form a 3D integrated circuit structure 300. Inter-level signal paths may be formed by techniques known to those of ordinary skill in the art, to each level of circuitry 216 through the underlying foundation material 212 and oxide material 218 of the next subsequent level. The number of circuitry levels 216 which may be formed is largely dictated by the number and complexity of required inter-level signal paths. For NAND flash memory, it is contemplated that a 3D circuit comprising three circuit levels 216, 216' and 216" may be respectively fabricated on three levels of foundation material 212, 212' and 212", although such number of circuit levels is not limiting of the scope of the invention. FIG. 1G depicts three such circuit levels 216, 216' and 216".

Figure 1H:
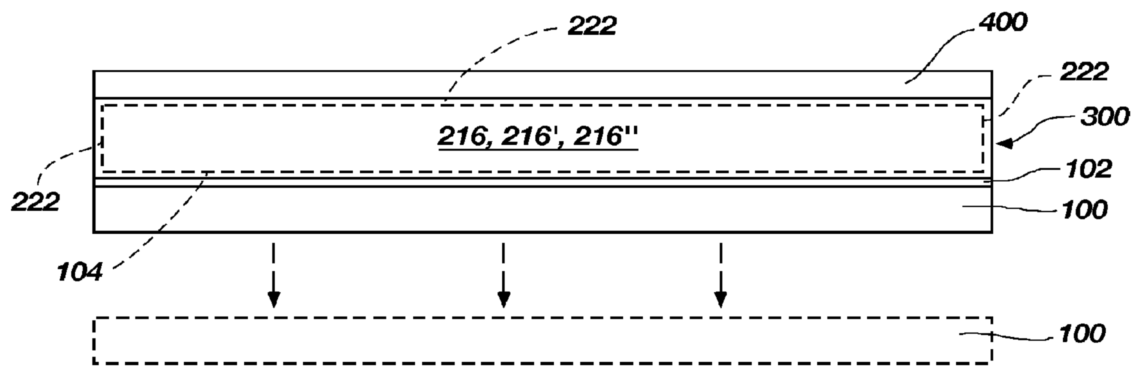

The circuitry of 3D integrated circuit structure 300 may then be probe tested in a conventional manner from the top thereof and, as also depicted in FIG. 1G in broken lines, silicon nitride 222 is formed over all of the circuit levels 216, 216' and 216" and the lateral peripheries thereof, to contact with passivation material 104 which, as noted above, also comprises silicon nitride. Thus, the entire 3D integrated circuit structure 300 is encapsulated on its top, bottom and sides in silicon nitride passivation material 104 and silicon nitride 222. Optionally, as depicted in FIG. 1H, a carrier substrate 400 may then be bonded to the 3D integrated circuit structure 300 opposite acceptor substrate 100. Such bonding may comprise adhesive bonding, and carrier substrate 400 may comprise, for example, a glass, silicon or a ceramic. It may be desirable to employ a material for carrier substrate 400, which is transparent to ultraviolet (UV) radiation, for reasons noted below.

As also shown in FIG. 1H, acceptor substrate 100 may then be removed from 3D integrated circuit structure 300 by a wet chemical etch which is highly selective to etch silicon oxide that is between the silicon of acceptor substrate 100 and silicon nitride passivation material 104 and silicon nitride 222, which encapsulates the levels of circuitry 216, 216' and 216". The wet chemical etch may include, but is not limited to a hydrofluoric acid (HF)-based etchant, such as an etchant including water, HF, and ammonium fluoride or water, HF, ammonium fluoride, and isopropyl alcohol. The acceptor substrate 100 may then be reused by formation of another sacrificial material 102 thereon, followed by another passivation material 104 and a dielectric material 106 (FIG. 1A). Consequently, the acceptor substrate 100 may be employed a large number of times, as little, if any, of the substrate material is consumed during each fabrication sequence.

Figure 1I:
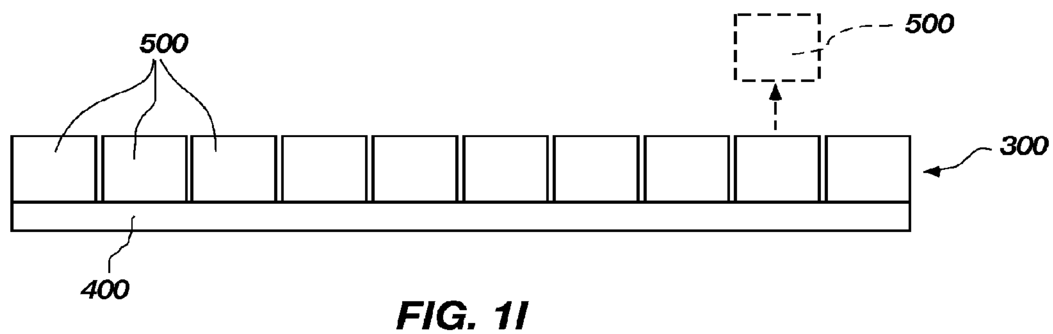
Figure 2:
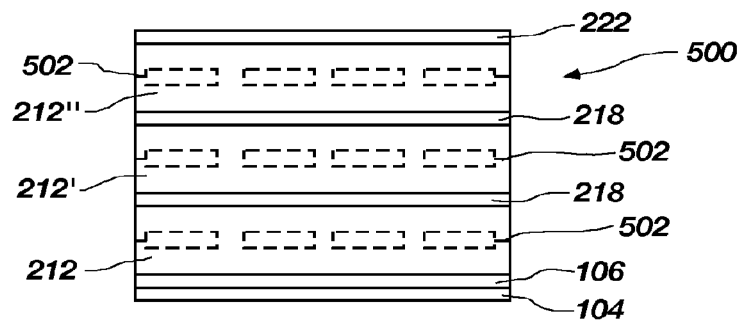
FIG. 2 is a schematic side sectional illustration of a semiconductor die according to an embodiment of the invention.

The 3D integrated circuit structure 300 with optional carrier substrate 400 bonded thereto may then be inverted, as depicted in FIG. 1I, individual, multi-level semiconductor dice 500 (FIG. 2) singulated therefrom as known in the art, and removed from carrier substrate 400 in a conventional pick-and-place sequence. As noted above, a UV-transparent material for carrier substrate 400 may be employed, enabling the use of an adhesive which is UV-sensitive and of the type conventionally employed to adhere a semiconductor wafer to a film for singulation to be used to bond carrier substrate 400 to 3D integrated circuit structure 300. After removal of acceptor substrate 100 and inversion of 3D integrated circuit structure 300 with carrier substrate 400, singulation may be effected using a conventional wafer saw and the UV-sensitive adhesive then exposed through the carrier substrate 400 to permit release of the singulated semiconductor dice 500 therefrom. Semiconductor dice 500, to the extent circuit levels 216, 216' and 216" are not internally connected, may be mutually electrically interconnected and connected to a permanent carrier substrate through edge-connect techniques well-known to those of ordinary skill in the art using conductive contacts 502 at one or more circuit levels exposed at their lateral peripheries by the singulation process. In other words, conductive traces may be formed across streets between locations of individual semiconductor dice, to be severed during singulation and expose ends thereof. Electrical connections may also be established between 3D integrated circuit structure 300 and an end-product or intermediate product carrier substrate such as a card or board bearing circuitry and, optionally, other semiconductor dice and other components thereon, through conductive vias on the bottom of the 3D integrated circuit structure 300 formed during circuit fabrication. The vias may be exposed by masking and etching the overlying silicon nitride while 3D integrated circuit structure 300 is still secured to carrier substrate 400, a redistribution layer of circuit traces formed and discrete conductive elements (e.g., solder bumps, or conductive or conductor-filled polymer bumps, columns, studs, etc.) formed or disposed on terminal pads of the circuit traces.

Figure 3A:
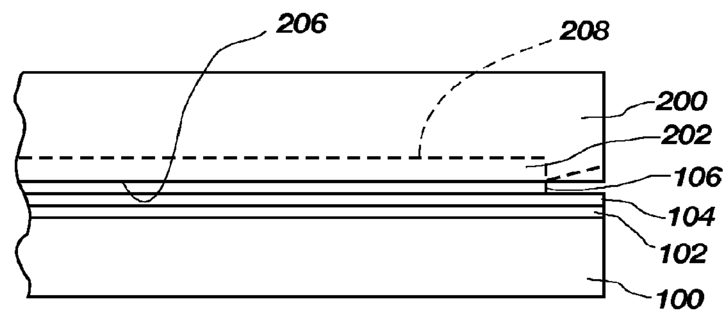
FIGS. 3A-3C are partial, enlarged side cross-sectional representations of a multi-level circuit under fabrication in accordance with an embodiment of the present invention.
Figure 3B:
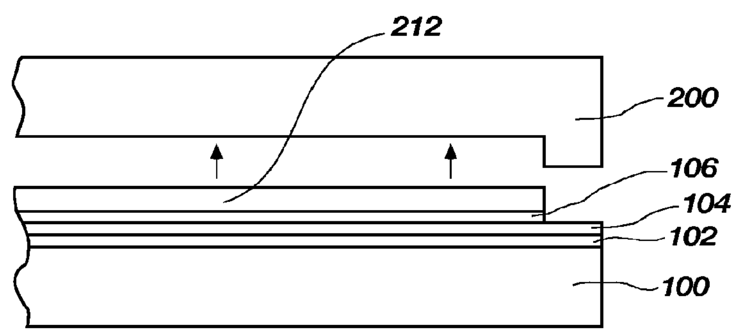
Figure 3C:
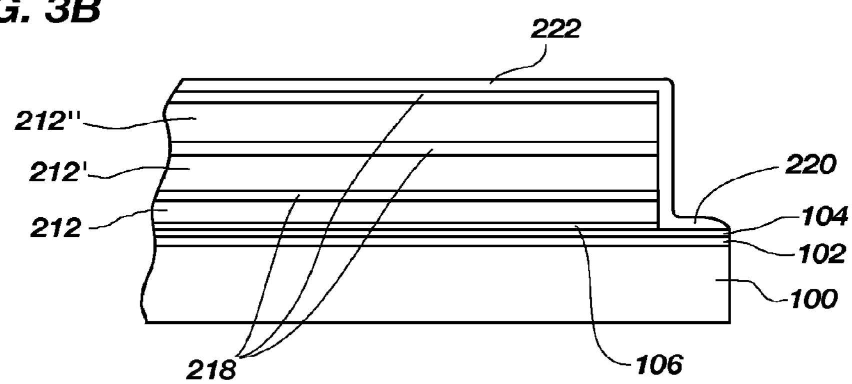
Figure 5:
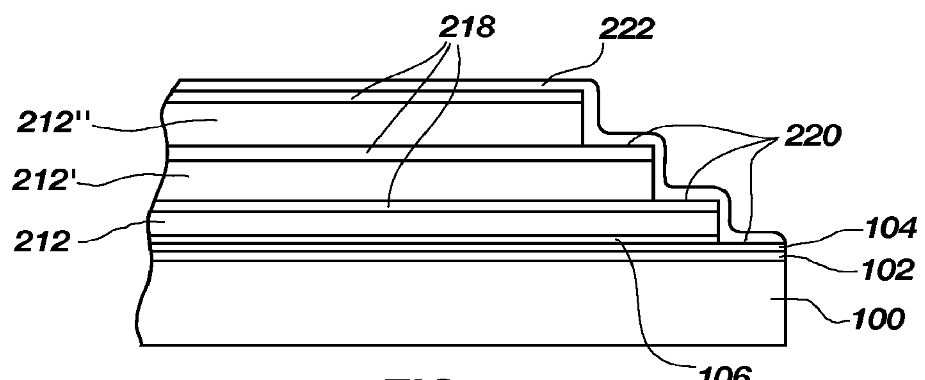
FIG. 5 is a partial, enlarged side cross-sectional representation of another embodiment of a multi-level circuit under fabrication in accordance with an embodiment of the present invention.

In a further embodiment depicted in FIG. 3C, lowermost foundation material 212 may be set back from the periphery of acceptor substrate 100, while each of the levels of foundation material 212, 212' and 212" may be peripherally coextensive. Alternatively, each foundation material 212, 212' and 212" may comprise a periphery that is set back from the next lower foundation material, and the lowermost foundation material 212 set back from the periphery of acceptor substrate 100, as depicted in FIG. 5. Either such architecture may be achieved by selectively treating the major surface 206 of a donor substrate 200 so that ion implantation is not effected to the outer lateral periphery thereof. In other words, ion implantation is effected only within a selected boundary inward of the outer lateral periphery of a donor substrate 200. For example, as shown in enlarged detail in FIG. 3A, acceptor substrate 100 having sacrificial material 102, passivation material 104 and dielectric material 106 disposed thereon is located in proximity to a donor substrate 200 which has been ion-implanted in a region of major surface 206 interior of the periphery. As donor wafer 200 is bonded by an anneal to dielectric material 106, a strong bond therebetween is formed only in the region of ion implantation. Thus, when donor substrate 200 is sheared to release a foundation material 212, as depicted in FIG. 3B, the unimplanted peripheral region of donor substrate 200 adjacent to acceptor substrate 100 remains attached to donor wafer 200. To further prevent peripheral bonding between donor substrate 200 and acceptor substrate 100 the dielectric layer 106 may, if desired, optionally be formed inwardly of the periphery of acceptor substrate 100 as shown in FIG. 3A, by masking and etching dielectric layer 106 after formation of passivation layer 104. Alternatively, a periphery of donor substrate 200 may be slightly beveled, as shown in broken lines in FIG. 3A, to a depth less than that to which ions are implanted. Such beveling may be effected when major surface 206 of donor substrate 200 may be smoothed, as by polishing, prior to ion implantation after a transfer region thereof has been bonded to a acceptor substrate 100 or a prior foundation material 212.

Figure 4:
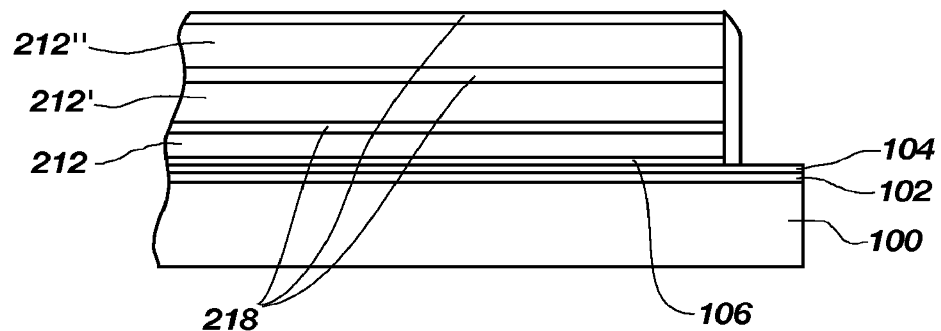
FIG. 4 is a partial, enlarged side cross-sectional representation of the multi-level circuit of FIG. 3C after performance of a spacer etch.

As depicted in FIG. 3C, the lowermost foundation material 212 may be set back from passivation layer 104 on acceptor substrate 100 to form a ledge 220. Then, as illustrated, each subsequent foundation material 212' and 212" is then sized and aligned over foundation material 212 to be peripherally coextensive therewith. Silicon nitride 222 is then formed by, for example, CVD or atomic layer deposition (ALD) over the structure, covering the upper surface of foundation material 212" and, optionally, an oxide material 218 thereover, as well as the lateral periphery of the multi-level structure, extending down the vertical side of 3D integrated circuit structure 300 along the sides of foundation materials 212, 212' and 212", to and over ledge 220 and in contact with passivation material 104. Peripheral, exposed dielectric material 106 outside of the footprint of the stacked foundation materials 212, 212' and 212" may be removed using a spacer etch prior to deposition of silicon nitride 222. As depicted in FIG. 4, an optional spacer etch of the silicon nitride 222 may be performed to expose a peripheral portion of passivation material 104.

In another embodiment, each of the levels of foundation material 212, 212' and 212" may be stepped back from the next lowermost foundation material 212, as depicted in FIG. 5, with silicon nitride 222 covering the sides of foundation materials 212, 212' and 212" of 3D integrated circuit structure 300 and extending over intervening ledges 220 to and over silicon nitride passivation material 104.

Although the foregoing description includes many specifics, these are not limiting of the scope of the present invention but, merely, as providing illustrations of some of embodiments. Similarly, other embodiments of the invention may be devised which are encompassed by the scope of the invention. Features from different embodiments may be employed in combination. The scope of the invention is, therefore, indicated and limited only by the appended claims and their legal equivalents, rather than by the foregoing description. All additions, deletions, and modifications to the invention as disclosed herein which fall within the meaning and scope of the claims are to be embraced thereby.

Conclusion

Embodiments of the present invention comprise methods of circuit fabrication on an acceptor substrate having no circuitry thereon. One or more levels of circuitry may be respectively and sequentially formed on levels of foundation material severed from a donor substrate after bonding to the acceptor substrate. After a desired number of levels of circuitry are formed, the resulting integrated circuit, encapsulated in a passivation material, is removed from the acceptor substrate. To effect the removal, a sacrificial material interposed between the circuitry and the acceptor substrate may be removed, as by etching with an etchant selective to the sacrificial material over the circuitry encapsulant and the acceptor substrate.

Embodiments of the invention comprise 3D integrated circuits, which may be singulated into individual semiconductor dice.

What is claimed is:

1. An integrated circuit structure, comprising:

a plurality of superimposed levels of integrated circuitry, each level separated from at least one other level by dielectric material;

silicon nitride encapsulating the plurality of superimposed levels of integrated circuitry;

an acceptor substrate;

a silicon oxide located between the silicon nitride and the acceptor substrate; and each level of the plurality of superimposed levels of integrated circuitry residing on a foundation material separated from a donor wafer, and a foundation material on which a lowermost level of integrated circuitry resides being bonded to a silicon oxide within the silicon nitride.

2. The integrated circuit structure of claim 1 wherein the acceptor substrate comprises ceramic material.

3. The integrated circuit structure of claim 1 wherein the acceptor substrate comprises defective semiconductor devices.

4. The integrated circuit structure of claim 1 wherein the acceptor substrate comprises monocrystalline silicon.

5. The integrated circuit structure of claim 1 wherein the foundation material between each level comprises semiconductor material.

6. A semiconductor structure, comprising:

an acceptor substrate comprising a surface having silicon nitride thereon, the acceptor substrate having a periphery;

a lowest-most foundation material bearing circuitry and having dielectric material thereover and positioned on the surface of the acceptor substrate to leave a periphery thereof exposed;

a highest-most foundation material bearing circuitry and having dielectric material thereover and having a periphery thereof exposed;

at least one intervening level of foundation material bearing circuitry and having dielectric material thereover and having a periphery thereof exposed, the at least one intervening level of foundation material being elevationally between the lowest-most and highest-most foundation materials;

the periphery of the lowest-most foundation material being set back from the acceptor substrate periphery, the periphery of each intervening level of foundation material being set back from the periphery of the next lower foundation material, the highest-most foundation material being set back from a highest of the at least one intervening level of foundation material; and silicon nitride extending over the highest-most foundation material and the exposed peripheries of the highest-most foundation material and the at least one intervening level of foundation material to and in contact with the silicon nitride on the acceptor substrate surface.

7. The structure of claim 6 wherein the lowest-most foundation material, the at least one intervening level of foundation material, and the highest-most foundation material bear circuitry comprising multiple un-singulated die sites.

8. A semiconductor die, comprising:

a plurality of superposed circuit levels, each respectively residing on a silicon segment sheared from a wafer wherein each of the silicon segments was horizontally sheared from a wafer, wherein each of the silicon segments was horizontally sheared from a wafer;

dielectric material located between each circuit level and a silicon segment of a next-higher circuit level;

dielectric material located below a lowermost circuit level; and silicon nitride under the lowermost circuit level and over an uppermost circuit level.

9. The semiconductor die of claim 8, wherein sides of the semiconductor die are devoid of silicon nitride.

10. The semiconductor die of claim 9, wherein at least one circuit level of the plurality of circuit levels comprises conductive contacts exposed on at least one side thereof.

11. The die of claim 8 wherein each of the silicon segments was horizontally sheared from a wafer.

12. An integrated circuit structure, comprising:

a plurality of superimposed levels of integrated circuitry, each level separated from at least one other level by dielectric material, each level comprising multiple un-singulated die sites;

silicon nitride encapsulating the plurality of superimposed levels of integrated circuitry;

an acceptor substrate; and a silicon oxide located between the silicon nitride and the acceptor substrate.

13. The integrated circuit structure of claim 12, wherein each level of the plurality of superimposed levels of integrated circuitry resides on a foundation material separated from a donor wafer, and a foundation material on which a lowermost level of integrated circuitry resides is bonded to a silicon oxide within the silicon nitride.

14. A semiconductor structure, comprising:

an acceptor substrate comprising a surface having silicon nitride thereon;

a foundation material bearing circuitry having a dielectric material thereover and positioned on the surface of the acceptor substrate to leave a periphery thereof exposed, the foundation level bearing circuitry comprising multiple un-singulated die sites;

at least one other foundation material bearing circuitry and positioned on the dielectric material over the foundation material to leave a periphery thereof exposed, the at least one other foundation level bearing circuitry comprising multiple un-singulated die sites; and silicon nitride extending over the circuitry borne by the at least one other foundation material and the exposed periphery of the dielectric material covering the circuitry borne by the foundation material to and in contact with the silicon nitride on the acceptor substrate surface.

15. The semiconductor structure of claim 14, wherein the foundation material and the at least one other foundation material comprise at least three foundation materials, wherein all but a lowermost and an uppermost of the at least three foundation materials resides on a lower foundation material bearing circuitry covered by a dielectric material.

* * * * *

UNITED STATES PATENT AND TRADEMARK OFFICE

CERTIFICATE OF CORRECTION

PATENT NO. : 8,816,489 B2
APPLICATION NO. : 13/471048
DATED : August 26, 2014
INVENTOR(S) : Sandhu et al.

It is certified that error appears in the above-identified patent and that said Letters Patent is hereby corrected as shown below:

In the Specification

Column 1, line 11, delete "Parrat" and insert -- Parat --, therefor.

In the Claims

Column 9, lines 32-34, Claim 8, after "from a" delete "wafer wherein each of the silicon segments was horizontally sheared from a".

Signed and Sealed this
Twenty-eighth Day of October, 2014

Michelle K. Lee
*Deputy Director of the United States Patent and Trademark Office*